United States Patent
Zhou et al.

(10) Patent No.: US 10,012,691 B1
(45) Date of Patent: Jul. 3, 2018

(54) AUDIO OUTPUT DIAGNOSTIC CIRCUIT

(71) Applicant: QUALCOMM Incorporated, San Diego, CA (US)

(72) Inventors: Feng Zhou, Markham (CA); King Tam, Vaughan (CA); Shaowen Sun, Markham (CA); Rahul Gulati, San Diego, CA (US); Dariusz Krolikowski, Maple (CA); Peter Koster, Toronto (CA); Serafim Loukas, Jr., Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/806,212

(22) Filed: Nov. 7, 2017

(51) Int. Cl.
  *H04R 29/00* (2006.01)
  *G01R 31/28* (2006.01)

(52) U.S. Cl.
  CPC ....... *G01R 31/2856* (2013.01); *H04R 29/001* (2013.01)

(58) Field of Classification Search
  CPC .... H04R 29/00; H04R 29/001; H04R 29/006; H04R 29/007; H04R 3/00; H04R 3/12; H04R 5/04; G01R 31/2856
  See application file for complete search history.

(56) References Cited

U.S. PATENT DOCUMENTS

| | | | | |
|---|---|---|---|---|
| 4,887,298 A * | 12/1989 | Haigler | ................ | H03G 3/301 330/207 P |
| 6,072,884 A * | 6/2000 | Kates | ................ | H04R 25/453 381/318 |
| 9,734,822 B1 * | 8/2017 | Sundaram | ................ | G10L 15/08 |
| 2006/0093128 A1 * | 5/2006 | Oxford | ................ | H04M 9/082 379/406.01 |
| 2006/0142972 A1 * | 6/2006 | Cancilla | ............. | G05B 23/0229 702/183 |
| 2006/0210091 A1 * | 9/2006 | Okumura | ................ | H04R 3/02 381/71.11 |
| 2010/0232623 A1 * | 9/2010 | Martin | ................ | H04R 29/001 381/96 |
| 2011/0150231 A1 * | 6/2011 | Natarajan | ............ | H04R 25/453 381/60 |
| 2015/0139460 A1 * | 5/2015 | Pedersen | ............... | H04R 25/453 381/318 |
| 2016/0004499 A1 * | 1/2016 | Kim | .................... | G06F 3/04847 715/716 |

* cited by examiner

*Primary Examiner* — Thang Tran
(74) *Attorney, Agent, or Firm* — Patterson & Sheridan, LLP

(57) ABSTRACT

Various additional and alternative aspects are described herein. In some aspects, the present disclosure provides a method of testing a system-on-chip (SoC). The method includes generating data for a plurality of audio channels. The data comprises first data corresponding to a first audio channel and second data corresponding to a second audio channel. The method further includes outputting the first audio channel over a first output port of the SoC for output by a speaker. The method further includes outputting the second audio channel over a second output port. The method further includes looping back the second audio channel from the second output port to a first input port of the SoC as third data. The method further includes comparing the third data to the second data. The method further includes determining if the SoC is operating correctly based on the comparison of the third data to the second data.

30 Claims, 5 Drawing Sheets

AUDIO OUTPUT DIAGNOSTIC CIRCUIT

TECHNICAL FIELD

The teachings of the present disclosure relate generally to system-on-chip (SoC) integrated circuit design, and more particularly, to testing functionality of a SoC.

INTRODUCTION

A modern automobile is a powerful and complex electro-mechanical system that includes a large number of processors, sensors, and systems-on-chips (SoCs) that control many of the vehicle's functions, features, and operations. More recently, manufacturers have begun equipping automobiles with Advanced Driver Assistance Systems (ADASs) that automate, adapt, or enhance the vehicle's operations. For example, an ADAS may be configured to use information collected from the automobile's sensors (e.g., accelerometer, radar, lidar, geospatial positioning, etc.) to automatically detect a potential road hazard, and assume control over all or a portion of the vehicle's operations (e.g., braking, steering, etc.) to avoid detected hazards. Features and functions commonly associated with an ADAS include adaptive cruise control, automated lane detection, lane departure warning, automated steering, automated braking, and automated accident avoidance.

Due to the speed at which automobiles travel, and the significant risk automobiles pose to passenger and pedestrian lives, today's automobiles are increasingly dependent on the speed, accuracy, safety, and security of the embedded electronic components. Speed, accuracy, safety, and security are particularly important in the SoCs that are used for automotive applications, such as the SoCs that include or control a vehicle's ADAS. Accordingly, new and improved circuits, components, systems, and solutions that better meet these and other demands of modern and future automobiles, including self-driving and autonomous vehicles, will be beneficial to car manufacturers, automotive engineers, consumers, and pedestrians.

BRIEF SUMMARY OF SOME EXAMPLES

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In some aspects, the present disclosure provides an audio output diagnostic circuit. The circuit includes at least one system-on-chip (SoC). The SoC is configured to generate data for a plurality of audio channels comprising a first audio channel and a second audio channel, wherein the data comprises first data corresponding to the first audio channel and second data corresponding to the second audio channel. The SoC is further configured to output the first audio channel over a first output port of the at least one SoC for output by a speaker. The SoC is further configured to output the second audio channel over a second output port. The SoC is further configured to loopback the second audio channel from the second output port to a first input port of the at least one SoC as third data. The SoC is further configured to compare the third data to the second data. The SoC is further configured to determine if the circuit is operating correctly based on the comparison of the third data to the second data.

In some aspects, the present disclosure provides a method for testing a system-on-chip (SoC). The method includes generating data for a plurality of audio channels comprising a first audio channel and a second audio channel, wherein the data comprises first data corresponding to the first audio channel and second data corresponding to the second audio channel. The method further includes outputting the first audio channel over a first output port of the SoC for output by a speaker. The method further includes outputting the second audio channel over a second output port. The method further includes looping back the second audio channel from the second output port to a first input port of the SoC as third data. The method further includes comparing the third data to the second data. The method further includes determining if the SoC is operating correctly based on the comparison of the third data to the second data.

In some aspects, the present disclosure provides an audio output diagnostic circuit. The circuit includes means for generating data for a plurality of audio channels comprising a first audio channel and a second audio channel, wherein the data comprises first data corresponding to the first audio channel and second data corresponding to the second audio channel. The circuit further includes means for outputting the first audio channel over a first output port of a system-on-chip (SoC) for output by a speaker. The circuit further includes means for outputting the second audio channel over a second output port. The circuit further includes means for looping back the second audio channel from the second output port to a first input port of the SoC as third data. The circuit further includes means for comparing the third data to the second data. The circuit further includes means for determining if the SoC is operating correctly based on the comparison of the third data to the second data.

In some aspects, the present disclosure provides a computer readable medium having instructions stored thereon for causing a circuit to perform a method of testing a system-on-chip (SoC). The method includes generating data for a plurality of audio channels comprising a first audio channel and a second audio channel, wherein the data comprises first data corresponding to the first audio channel and second data corresponding to the second audio channel. The method further includes outputting the first audio channel over a first output port of the SoC for output by a speaker. The method further includes outputting the second audio channel over a second output port. The method further includes looping back the second audio channel from the second output port to a first input port of the SoC as third data. The method further includes comparing the third data to the second data. The method further includes determining if the SoC is operating correctly based on the comparison of the third data to the second data.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
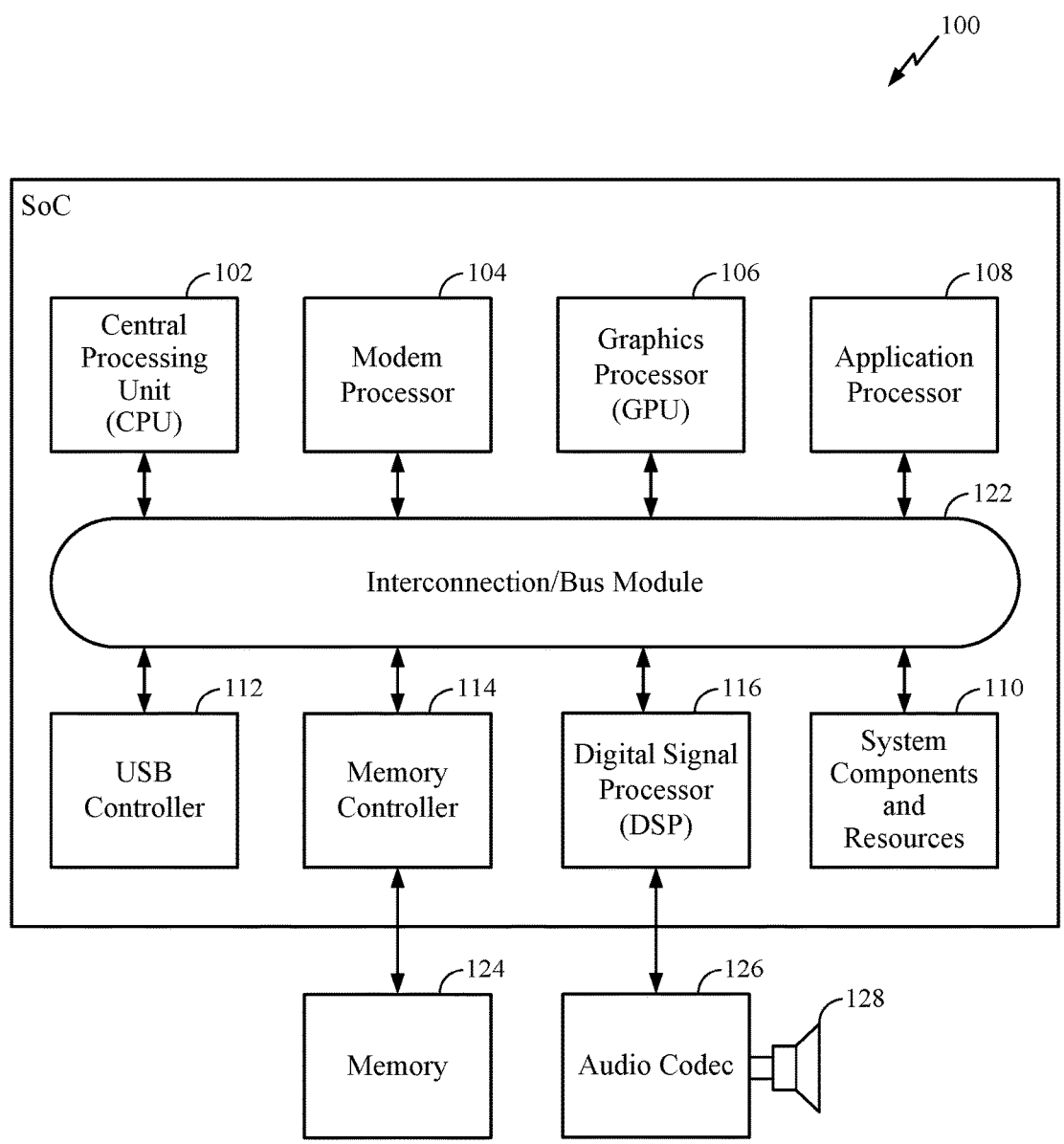
FIG. 1 is a block diagram of example components and interconnections in a system-on-chip (SoC).

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Although the teachings of this disclosure are illustrated in terms of integrated circuits (e.g., a SoC), the teachings are applicable in other areas. The teachings disclosed should not be construed to be limited to SoC designs or the illustrated embodiments. The illustrated embodiments are merely vehicles to describe and illustrate examples of the inventive teachings disclosed herein.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors, modem processors, video processors, etc.), memory blocks (e.g., ROM, RAM, Flash, etc.), and resources (e.g., timers, voltage regulators, oscillators, etc.), any or all of which may be included in one or more cores.

A number of different types of memories and memory technologies are available or contemplated in the future, all of which are suitable for use with the various aspects. Such memory technologies/types include phase change memory (PRAM), dynamic random-access memory (DRAM), static random-access memory (SRAM), non-volatile random-access memory (NVRAM), pseudostatic random-access memory (PSRAM), double data rate synchronous dynamic random-access memory (DDR SDRAM), and other random-access memory (RAM) and read-only memory (ROM) technologies known in the art. A DDR SDRAM memory may be a DDR type 1 SDRAM memory, DDR type 2 SDRAM memory, DDR type 3 SDRAM memory, or a DDR type 4 SDRAM memory. Each of the above-mentioned memory technologies include, for example, elements suitable for storing instructions, programs, control signals, and/or data for use in or by a computer or other digital electronic device. Any references to terminology and/or technical details related to an individual type of memory, interface, standard or memory technology are for illustrative purposes only, and not intended to limit the scope of the claims to a particular memory system or technology unless specifically recited in the claim language.

Certain aspects of the present disclosure propose techniques for monitoring and testing audio systems of a SoC. For example, certain aspects relate to techniques for ensuring that audio warnings for safety critical use cases are played back and output (e.g., from one or more speakers). The audio warnings may be for a vehicle (e.g., automotive vehicle) and may correspond to audio warnings from an instrument cluster, rear view camera application, ADAS application, etc. of the vehicle.

For example, safety critical ADAS applications may need to fulfill functional safety requirements (e.g., as mandated by the ISO 26262 functional safety standard for road vehicles). That means that any device used in a vehicle may need to fulfill functional safety requirements, including SoCs utilized in automotive applications. Current SoCs include audio software and are configured to output audio. Such SoCs, therefore, could be used in automotive applications to generate and output audio. However, such current SoCs may not meet functional safety requirements for use in a vehicle. In particular, the functional safety requirements may require that safety goals (e.g., playback of safety sounds at the correct time, playback of safety sounds without interference or corruption, etc.) not be violated such as due to faults in the audio software running on the SoCs or subsystems of the SoC that provide audio data to external audio codecs for output through one or more speakers. Accordingly, certain aspects herein relate to monitoring and testing audio systems of a SoC, which may be used to ensure that audio functional safety requirements are met by the SoC. In certain aspects, the techniques described herein may be used to allow an audio subsystem of a SoC to simultaneously or in parallel handle both safety critical and non-safety critical content for automotive applications.

The various aspects may be implemented in a wide variety of computing systems, including single processor systems, multiprocessor systems, multicore processor systems, systems-on-chip (SoC), or any combination thereof.

FIG. 1 is a block diagram of example components and interconnections in a system-on-chip (SoC) 100 suitable for implementing various aspects of the present disclosure. The SoC 100 may include a number of heterogeneous processors, such as a central processing unit (CPU) 102, a modem processor 104, a graphics processor 106, an application processor 108, and a digital signal processor (DSP) 116. Each processor 102, 104, 106, 108, 116, may include one or more cores, and each processor/core may perform operations independent of the other processors/cores. Each processor 102, 104, 106, 108, 116 may be part of a subsystem (not shown) including one or more processors, caches, etc. configured to handle certain types of tasks or computations. It should be noted that SoC 100 may include additional processors (not shown) or may include fewer processors (not shown).

The SoC 100 may include system components and resources 110 for managing sensor data, analog-to-digital conversions, wireless data transmissions, and for performing other specialized operations (e.g., decoding high-definition video, video processing, etc.). System components and resources 110 may also include components such as voltage regulators, oscillators, phase-locked loops, peripheral bridges, data controllers, system controllers, access ports, timers, and other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a universal serial bus (USB) controller 112, and one or more memory controllers 114 (e.g., a dynamic random access memory (DRAM) memory controller). The SoC 100 may also include an input/output module (not shown) for communicating with resources external to the SoC, such as a clock and a voltage regulator, each of which may be shared by two or more of the internal SoC components.

The processors 102, 104, 106, 108, 116 may be interconnected to the USB controller 112, the memory controller 114, system components and resources 110, and other system components via an interconnection/bus module 122, which may include an array of reconfigurable logic gates and/or implement a bus architecture (e.g., CoreConnect, AMBA, etc.). Communications may also be provided by advanced interconnects, such as high performance networks-on chip (NoCs).

The interconnection/bus module 122 may include or provide a bus mastering system configured to grant SoC components (e.g., processors, peripherals, etc.) exclusive control of the bus (e.g., to transfer data) for a set duration, number of operations, number of bytes, etc. In an aspect, the bus module 122 may include a direct memory access (DMA) controller (not shown) that enables components connected to the bus module 122 to operate as a master component and initiate memory transactions. The bus module 122 may also implement an arbitration scheme to prevent multiple master components from attempting to drive the bus simultaneously.

The memory controller 114 may be a specialized hardware module configured to manage the flow of data to and from a memory 124. The memory controller 114 may include logic for interfacing with the memory 124, such as selecting a row and column in a cell array of the memory 124 corresponding to a memory location, reading or writing data to the memory location, etc.

The memory 124 may be an on-chip component (e.g., on the substrate, die, integrated chip, etc.) of the SoC 100, or alternatively (as shown) an off-chip component.

The DSP 116 may be configured to process audio signals, such as both safety critical (e.g., audio warning sound, alarm sound, warning dialog sound, etc.) and non-safety critical content (e.g., music, radio/media playback, etc.) for automotive applications. The DSP 116 may further be coupled to an audio codec 126. Audio codec 126 may include an analog to digital converter (ADC) and a digital to analog converter (DAC) (not shown). For example, audio codec 126 may be configured to convert audio signals output from DSP 116 from digital to analog for playback on speaker 128. Audio codec 126 may further be configured to convert audio signal input into audio codec 126 from analog to digital for further input to DSP 116 for processing. For example, a microphone or other analog input (not shown) may be used to input an analog audio signal into audio codec 126 for conversion from analog to digital. Audio codec 126 may be an off-chip component (as shown), or an on-chip component (not shown).

Figure 2:
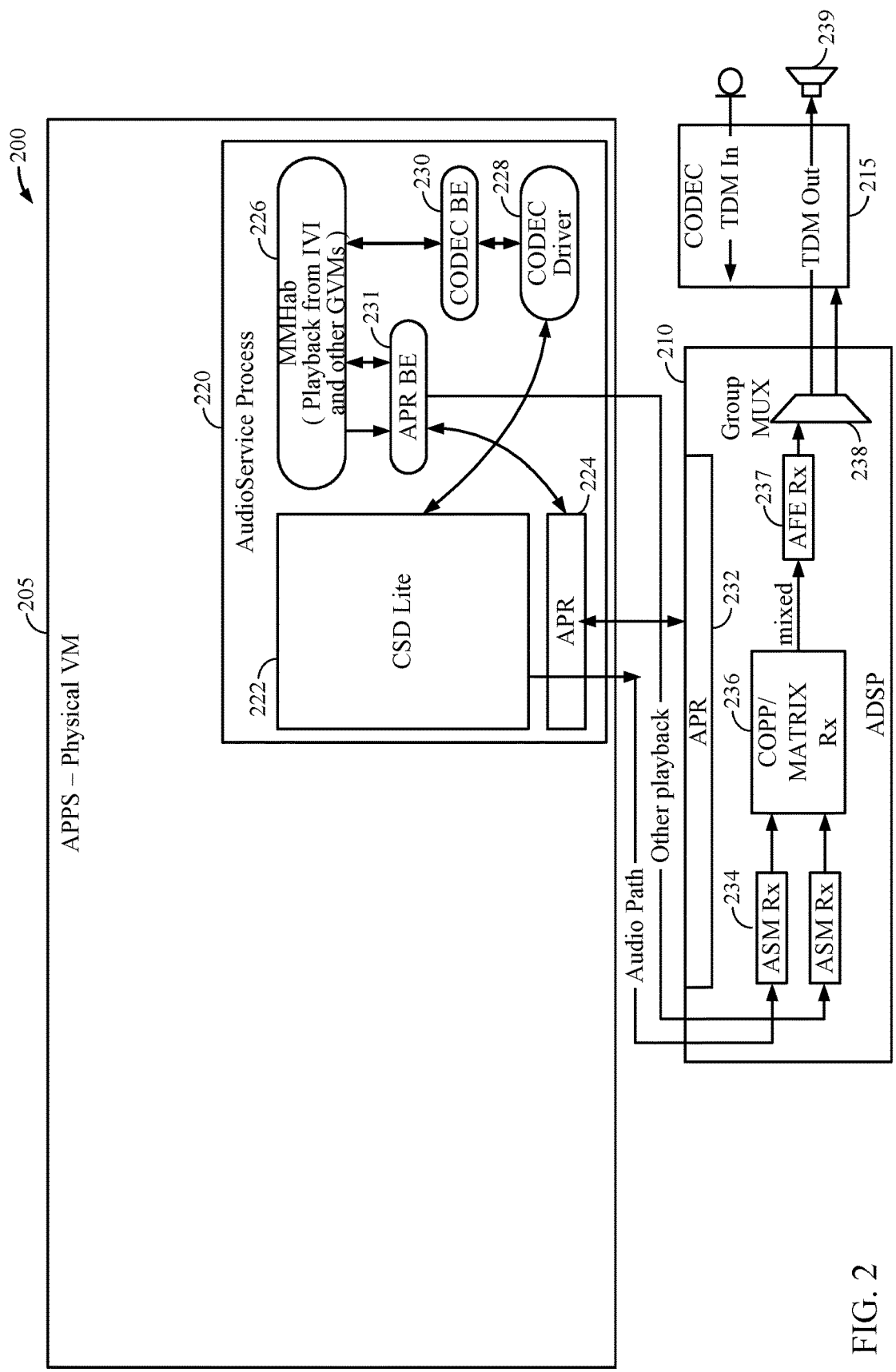
FIG. 2 is a block diagram of example components in a conventional system-on-chip (SoC) used for audio applications.

FIG. 2 is a block diagram of example components in a conventional system-on-chip (SoC) used for audio applications. As shown, SoC 200 includes an application processor 205, a DSP 210, and an audio codec 215. The application processor 205 is configured to execute/run an audio service process 220. The audio service process 220 may be configured to provide application programming interfaces (APIs) to other modules or services running on SoC 200 to allow for capture and play back of audio (e.g., pulse code modulation (PCM) sound). As shown, in certain aspects, the audio service process 220 includes a core sound driver (CSD) (lite) 222 and an audio packer router (APR) 224. The CSD 222 may be configured to receive audio data from other services or modules for playback. The CSD 222 may communicate with codec driver 228 for formatting/encoding the audio data in an appropriate format. CSD 222 may then pass the audio data to APR 224. APR 224 may generate packets from the audio data and transmit the packets including audio data to DSP 210.

In certain aspects, audio service process 220 may also include a multimedia hypervisor abstraction layer (MMHab) 226. The MMHab 226 may be configured to act as an interface between virtual machines (VM) running on SoC 200 (e.g., on AP 205) and physical resources of the SoC 200 (e.g., processors, memory, etc.). For example, a guest VM (e.g., corresponding to an in vehicle infotainment (IVI)) may run on SoC 200 (not shown) and generate audio data (e.g., music, speech, notification sounds, etc.) for playback. The guest VM may pass the audio to the MMHab 226. MMHab 226 may communicate with the codec driver 228 via a codec driver back end (BE) 230 to format/encode the audio data in an appropriate format. MMHab 226 may pass the audio data to APR 224 via APR BE 231. APR 224 may generate packets from the audio data and transmit the packets including audio data to DSP 210.

DSP 210 may include an APR 232 configured to receive the packets including audio data from APR 224 and extract the audio data from the packets. DSP 210 may also include one or more audio stream managers (ASMs) 234, which manage the flow of audio data. For example, ASMs 234 may be configured to receive the extracted audio data from APR 232, which is configured to pass the extracted audio data to ASMs 234. APR 232 may be configured to determine which ASM 234 to pass extracted audio data to based on headers of the packets the extracted audio data was included in, the headers indicating the source of the audio data. For example, one audio stream manager 234 may be configured to receive audio data generated by CSD 222 and manage the flow of audio data through DSP 210 so that audio is played back at the appropriate time and speed. Another audio stream manager 234 may be configured to receive audio data from MMHab 226.

The one or more ASMs 234 may output the audio data to a common object pre/postprocessor/matrix (COPP/Matrix) 236, which may further process and mix the audio data from the ASMs 234 and output the mixed audio data to audio front end (AFE) 237. In certain aspects, AFE 237 conditions the mixed audio data for output to codec 215. The one or more ASMs 234, COPP/Matrix 236, and AFE 237 may be receive (Rx) units meaning they are configured to process audio data received by APR 232, as opposed to transmit (Tx) units which are configured to process audio data being recorded/input and to be transmit by APR 232.

In certain aspects, the DSP 210 includes one or more ports for inputting and/or outputting audio data from/to audio codec 215. The one or more ports may refer to time division multiplexed (TDM) ports that transfer data on the same physical data line, but at different time periods in a time sharing manner. Each of the one or more ports may be configured to input and/or output a separate channel of audio data. In certain aspects, DSP 210 includes a multiplexer 238 that selects from one or more inputs (e.g., an output of AFE 237) and outputs a signal form the selected input to codec 215. For example, the multiplexer 238 may select different inputs at different time periods to generate the TDM audio signal output to audio codec 215. Audio codec 215 may then convert the digital audio channel(s) from DSP 210 to analog signals and output the audio over speaker 239.

Figure 3:
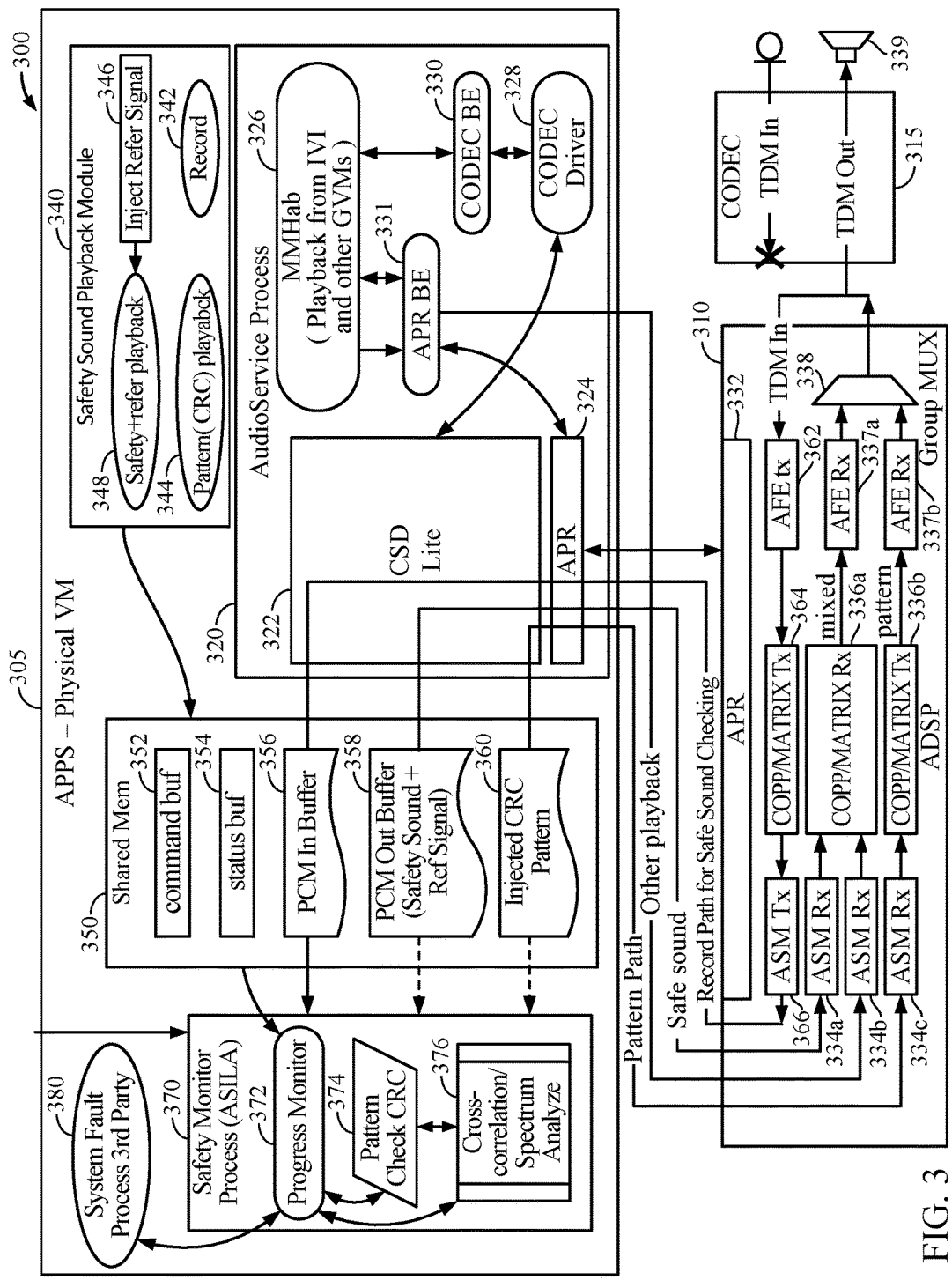
FIG. 3 is a block diagram of example components and interconnections in a system-on-chip (SoC) suitable for implementing various aspects of the present disclosure.

FIG. 3 is a block diagram of example components and interconnections in a SoC suitable for implementing various aspects of the present disclosure. As shown, SoC 300, like SoC 200, includes an application processor 305 (e.g., similar to application processor 205), a DSP 310 (e.g., similar to DSP 210), and an audio codec 315 (e.g., similar to audio codec 215).

Unlike SoC 200, however, in addition to application processor 305 being configured to run an audio service process 320 (e.g., similar to audio service process 220, including CSD 322, APR 324, MMHab 326, codec driver 328, codec driver BE 330, and APR BE 331), the application processor 305 is configured to run additional processes for implementing various aspects of the present disclosure.

In certain aspects, SoC 300 is configured to execute a safety sound playback module 340. The safety sound playback module 340 may include a recording module 342 configured to setup a recording path for recording input audio data as further described herein. The safety sound playback module 340 may further include a known data pattern module 344 configured to setup a playback path for outputting a known data pattern as further described herein. In certain aspects, the known data pattern may not correspond to a sound, but rather is just a preset pattern of bits (e.g., a random binary number, data similar to a cyclic redundancy check (CRC), etc.). In addition or alternative to known data pattern module 344, safety sound playback module 340 may include a reference signal injector 346 that may generate a reference signal (e.g., a tone, set of tone, or waveform used as a reference signal) and injects the reference signal (e.g., mixes, overlays, etc.) the reference signal into a safety sound (e.g., audio warning sound, alarm sound, warning dialog sound, etc.) to generate a combined signal of data corresponding to the safety sound and the reference signal. In such aspects, the safety playback module 340 includes a combined signal playback module 348 configured to setup a playback path for outputting the combined signal as further described herein.

The safety sound playback module 340 may allow the SoC 300 to output a safety sound via speaker 339. For example, if some safety event (e.g., a door is left ajar, a lane departure is detected, etc.) occurs in a vehicle that includes SoC 300, the safety sound playback module 340 may be configured to generate the safety sound and output the safety sound via speaker 339 as further discussed herein. Further, the SoC 300 may additionally output non-safety critical sounds via speaker 339, similar to as discussed with respect to SoC 200. In certain aspects, as discussed, it may be beneficial to ensure that the safety sound is played back via speaker 339, and further that the playback is not corrupted (e.g., by playback of the non-safety critical sound, by corruption along the datapath from safety sound playback module 340 to speaker 339, etc.). Accordingly, as discussed herein, additional data (e.g., the known data pattern and/or reference signal) may be passed along the datapath from safety sound playback module 340, but before being output to speaker 339, the additional data is looped back into the SoC 300. The looped back data is examined to see if it has been corrupted to determine if playback of the safety sound is corrupted. In certain aspects, the additional data (e.g., a known data pattern) is never actually output by speaker 339. In certain aspects, the additional data (e.g., reference signal) is output by speaker 339 (e.g., though may not be audible to humans). However, in such aspects, the actual playback from speaker 339 is not detected with a microphone and examined, but rather the data as looped back is examined.

The safety sound playback module 340 may pass audio data (e.g., a safety sound, a known data pattern, and/or a combined signal) to audio service process 320 for playback. For example, safety sound playback module 340 may receive a command from another module to play a safety sound and pass audio data for playback to audio service 320, accordingly. Audio service process 320 may store the audio data in a shared memory module 350. The shared memory module 350 may be backed by physical storage such as a cache (not shown) or any other suitable memory. The shared memory module 350 may include a command buffer 352, a status buffer 354, an audio input buffer 356, an audio output buffer 358, and a data pattern buffer 360.

The command buffer 352 may be used by safety sound playback module 340, audio service 320, and a safety monitor process 370 to communicate between one another, such as communicating commands between one another. For example, safety sound playback module 340 may generate commands or messages including audio data for playback and store them in command buffer 352. Audio service process 320 may read the command or message from command buffer 352. Audio service process 320 may then process the audio data to generate audio data suitable for output (e.g., PCM data). In certain aspects, if the audio data from safety sound playback module 340 includes a safety sound and known data pattern, then processed audio data corresponding to the safety sound may be stored in audio output buffer 358, and the known data pattern may be stored in data pattern buffer 360. If the audio data from safety sound playback module 340 includes a combined signal, then processed audio data corresponding to the combined signal may be stored in audio output buffer 358. Audio service process 320 may further store information in status buffer 354 indicating that safety sound playback module 340 has requested playback of a safety sound.

APR 324 (e.g., similar to APR 224) may generate packets to transmit audio data from audio service process 320 to DSP 310. DSP 310 may include an APR 332 (e.g., similar to APR 232) configured to receive the packets including audio data from APR 324 and extract the audio data from the packets. DSP 310 may also include one or more ASMs 334 (e.g., similar to ASMs 234), which manage the flow of audio data. For example, ASMs 334 may be configured to receive the extracted audio data from APR 332, which is configured to pass the extracted audio data to ASMs 334. APR 332 may be configured to determine which ASM 334 to pass extracted audio data to based on headers of the packets the extracted audio data was included in, the headers indicating the source or type of the audio data. For example, one audio stream manager 334a may be configured to receive audio including the safety sound (e.g., just the safety sound or a combined signal). Another audio stream manager 334b may be configured to receive audio data from MMHab 326, such as non-safety critical audio playback (e.g., music, radio/media playback, etc.). In some aspects, an audio stream manager 334c may be configured to receive a known data pattern. The safety sound, known data pattern, and non-safety critical audio playback may be separate streams of audio, and therefore use different ASMs 334 to manage the separate audio streams in parallel.

ASMs 334a and 334b may output the audio data to a COPP/Matrix 336a (e.g., similar to COPP/Matrix 236), which may further process and mix the audio data from the ASMs 334a and 334b and output the mixed audio data to AFE 337a (e.g., similar to AFE 237). In certain aspects, AFE 337a conditions the mixed audio data for output to codec 315.

ASM 334c may output the audio data to a COPP/Matrix 336b (e.g., similar to COPP/Matrix 236), which may further process the audio data from the ASM 334c and output the audio data to AFE 337b (e.g., similar to AFE 237). In certain aspects, COPP/Matrix 336b may not be included, or may not perform mixing as the audio data from ASM 334c is not mixed with additional audio data.

The one or more ASMs 334, COPP/Matrices 336, and AFEs 337 may be receive (Rx) units meaning they are configured to process audio data received by APR 332, as opposed to transmit (Tx) units which are configured to process audio data being recorded/input and to be transmit by APR 332.

As discussed, the known data pattern module 344 is configured to setup a playback path for outputting the known data pattern. In certain embodiments, the playback path for outputting the known data pattern, as described, goes from safety sound playback module 340, to data pattern buffer 360, to audio service process 320, to ASM 334c, to COPP/Matrix 336b, to AFE 337b.

As discussed, the combined signal playback module 348 is configured to setup a playback path for outputting a combined signal of data corresponding to the safety sound and the reference signal. In certain embodiments, the playback path for outputting the combined signal, as described, goes from safety sound playback module 340, to audio output buffer 358, to audio service process 320, to ASM 334a, to COPP/Matrix 336a, to AFE 337a.

As discussed with respect to DSP 210, DSP 310 may include one or more ports for inputting and/or outputting audio data from/to audio codec 315. In certain aspects, DSP 320 includes a multiplexer 338 (e.g., similar to multiplexer 238) that selects from one or more inputs (e.g., an output of AFE 337a or 337b) and outputs a signal from the selected input. For example, the multiplexer 338 may select different inputs at different time periods to generate a TDM audio signal.

Unlike DSP 210, in DSP 310, one or more ports of the audio signal generated by multiplexer 338, in addition to or alternative to being output to codec 315, may be digitally looped back to an input port of DSP 310 as part of a recording path for recording input audio data. For example, as discussed, recording module 342 is configured to setup a recording path for recording input audio data. The recording path may include a path from an output port of DSP 310 that is looped back to an input port of DSP 310. The recording path may include an AFE 362, to a COPP/Matrix 364, to an ASM 366, to audio service process 320, to audio input buffer 356. AFE 362 may condition the data from the input port and output the data to a COPP/Matrix 364, which may further process the data and output the processed data to ASM 366. ASM 366 manages the input flow of data and sends the data to APR 332. APR 332 generates packets to transmit the data from DSP 310 to APR 324 of audio service process 320. APR 324 extracts the data from the packets and audio service process 320 inputs the data into audio input buffer 356. The safety monitor process 370 is then configured to analyze the audio data in audio input buffer 356 to determine if the safety sound playback data path is operating correctly.

For example, where audio stream manager 334a is configured to receive audio data corresponding to combined signal, the audio data output on a port of DSP 310 may not only be output to codec 315, but also looped back to an input port of DSP 310. The looped back combined signal may be stored in audio input buffer 356 and analyzed by safety monitor process 370 as further discussed herein.

In another example, where audio stream manager 334a is configured to receive audio data corresponding to a safety sound and audio stream manager 334c is configured to receive a known data pattern, one port of DSP 310 may output the audio data corresponding to the safety sound to codec 315. Further, another port of DSP 310 may output the known data pattern looped back to an input port of DSP 310, and not to codec 315. Accordingly, the known data pattern is not actually played back on speaker 339. The looped back known data pattern may be stored in audio input buffer 356 and analyzed by safety monitor process 370 as further discussed herein.

The safety monitor process 370 is configured to determine if the safety sound is being played correctly. In particular, safety monitor process 370 may include a progress monitor 372 configured to determine if a safety sound should have been played by reading status buffer 354 and determining if there is information stored in status buffer 354 indicating that safety sound playback module 340 has requested playback of a safety sound.

In certain aspects, if progress monitor 372 determines that a safety sound should have been played, then the safety monitor process 370 retrieves the audio data stored in the audio input buffer 356. If the audio data in the audio input buffer 356 is based on a known data pattern, then the safety monitor process 370 further reads the known data pattern stored in data pattern buffer 360. The safety monitor process 370, in certain aspects, includes a pattern check component 374 configured to determine if the audio data in audio input buffer 356 is the same pattern as stored in the data pattern buffer 360 and report the results to progress monitor 372. If the pattern check component 374 determines the audio data in audio input buffer 356 is the same pattern as stored in the data pattern buffer 360, then the function of SoC 300 may continue as normal. If the pattern check component 374 determines the audio data in audio input buffer 356 is not the same pattern as stored in the data pattern buffer 360, then the progress monitor 372 may send an indication to a system fault process 380 that starts a fault process for SoC 300 since the safety audio may not have been played back correctly since there may be some error in the portion of the audio output path of the safety sound that is also shared for outputting the known data pattern that corrupted the known data pattern along the audio output path so that it does not match the original known data pattern.

If the audio data in the audio input buffer 356 is based on a combined signal including a reference signal and a safety sound, the safety monitor process 370 determines if the audio data includes the reference signal. The safety monitor process 370, in certain aspects, includes a cross correlation/spectrum analysis component 376 configured to determine if the audio data in audio input buffer 356 includes the reference signal. For example, the cross correlation/spectrum analysis component 376 may cross-correlate a copy of the reference signal (e.g., stored in shared memory module 350) with the audio data, the results of the cross-correlation algorithm indicating whether or not the audio data includes the reference signal. In another example, the cross correlation/spectrum analysis component 376 may perform a spectrum analysis of the audio data in the frequency domain and compare the frequency spectrum of the audio data to a known frequency spectrum of the reference signal. If the audio data includes the frequency components of the reference signal, then the cross correlation/spectrum analysis component 376 determines that the audio data includes the reference signal, otherwise it determines that the audio data does not include the reference signal. If the cross correlation/spectrum analysis component 376 determines the audio data in audio input buffer 356 includes the reference signal, then the function of SoC 300 may continue as normal. If the cross correlation/spectrum analysis component 376 determines the audio data in audio input buffer 356 does not include the reference signal, the progress monitor 372 may send an indication to a system fault process 380 that starts a fault process for SoC 300 since the safety audio may not have been played back correctly since there may be some error in the audio output path of the combined signal including the safety sound that corrupted the combined signal along the audio output path so that it does not include the original reference signal.

In certain aspects, the cross correlation/spectrum analysis component 376 may further be configured to check the data quality of audio data in audio input buffer 356 for distortion or corruption. If analysis of the audio indicates distortion or corruption, then the progress monitor 372 may send an indication to a system fault process 380 that starts a fault process for SoC 300 since the safety audio may not have been played back correctly since there may be some error in the audio output path of the safety sound that corrupted the combined signal including the safety sound along the audio output path.

In certain aspects, progress monitor 372 is configured to check (e.g., periodically) data flow through the path or pipeline from safety sound playback module 340 through DSP 310 to determine if there are any errors in the data flow. For example, the progress monitor 372 may utilize APIs provided by CSD 322 to determine if there are any errors. If an error is detected in the data flow, then the progress monitor 372 may send an indication to a system fault process 380 that starts a fault process for SoC 300 since the safety audio may not have been played back correctly.

For example, CSD 322 may be configured to maintain one or more counters that CSD 322 increments as certain tasks or commands are performed. Progress monitor 372 may query CSD 322 for the value(s) of such one or more counters and determine if there are any errors in the data flow based on the value(s) of the one or more counters. For example, there may be a threshold frequency with which CSD 322 is expected to write new data to audio output buffer 358 for playback. Each time CSD 322 writes new data to audio output buffer 358 based on receiving a write command, the CSD 322 may update a counter indicative of the number of write commands received. Progress monitor 372 may track the change in the value of the counter over time, and if the rate of change is below a threshold, progress monitor 372 determines there is an error in the data flow.

In another example, CSD 322 increments a counter each time a packet is received by APR 324 and/or increments another counter each time a packet is transmitted by APR 324. There may be a threshold frequency with which CSD 322 is expected to transmit/receive packets to/from DSP 310 for playback. Progress monitor 372 may track the change in the value(s) of the counter(s) over time, and if the rate of change is below a threshold, progress monitor 372 determines there is an error in the data flow.

In a further example, DSP 310 may include a buffer (not shown) that is uses to store audio data received from application processor 305. ASM 334 may monitor the buffer, and when the buffer is empty (e.g., the audio data has been processed and output from an output port of DSP 310), ASM 334 may be configured to execute a callback event (e.g., an ASM WRITE DONE) to the application processor 305. Progress monitor 372 may query CSD 322 for whether the callback event was received at application processor 305 for audio data sent from application processor 305 to DSP 310 (e.g., based on status buffer 354 indicating audio data was sent). If the callback event is not received, progress monitor 372 determines there is an error in the data flow.

In yet another example, SoC 300 includes a DMA counter (not shown) that monitors all accesses to memory made by components of SoC 300. For example, whenever audio data is input/output to/from SoC 300, it is performed using DMA. The DMA counter accordingly is indicative of an amount of audio data played out or received at SoC 300. Progress monitor 372 may be configured to monitor (e.g., periodically) the value of the DMA counter. If the rate of change of the value of the DMA counter is below a threshold, progress monitor 372 determines there is an error in the data flow.

Figure 3A:
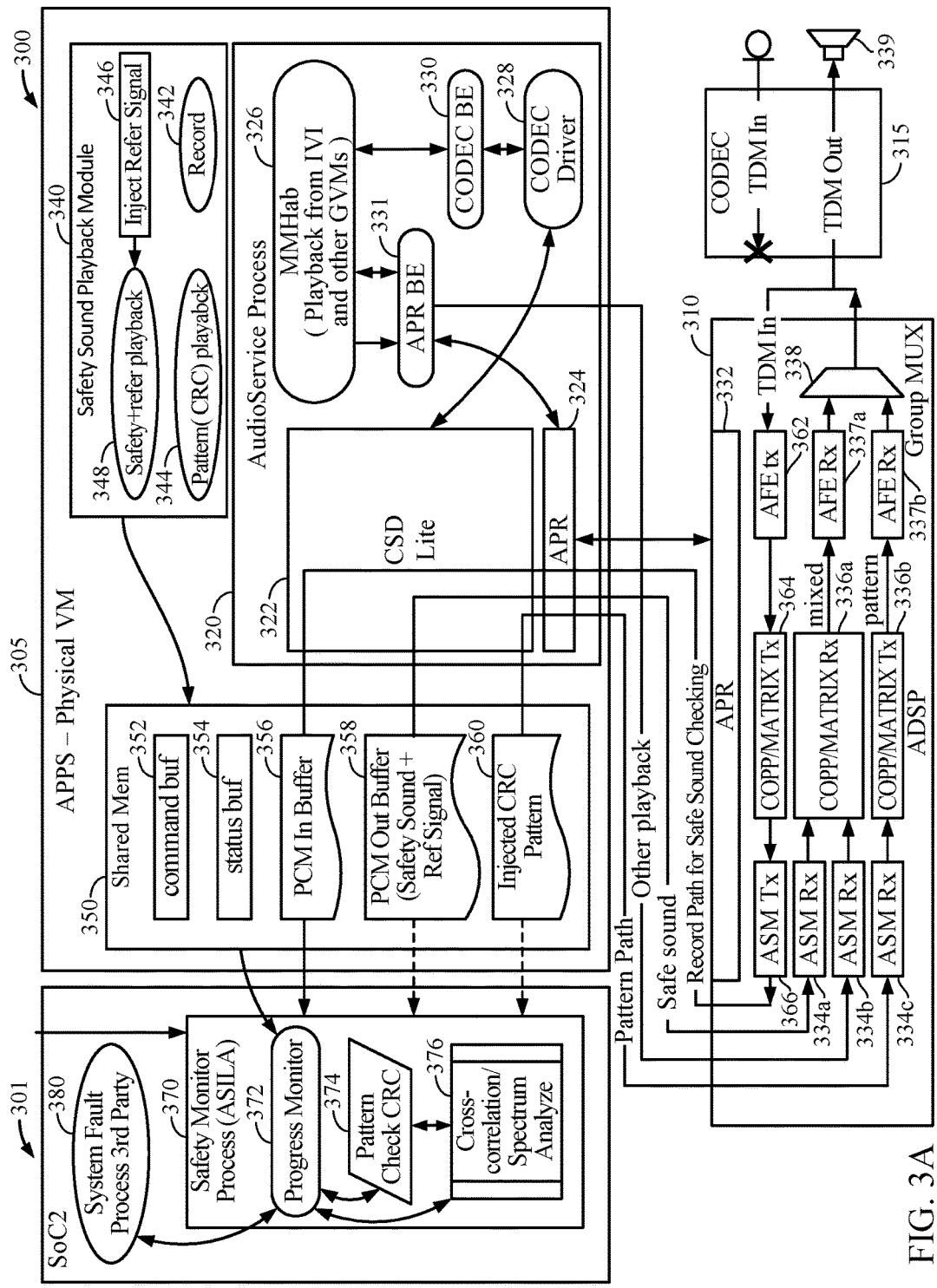
FIG. 3A is a block diagram of example components and interconnections in a plurality of system-on-chips (SoCs) suitable for implementing various aspects of the present disclosure.

As shown in FIG. 3, safety monitor process 370 executes on the same SoC 300, and the same application processor 305 as audio service process 320. However, it should be noted that safety monitor process 370 may execute on a separate processor in SoC 300, or may even operate on a separate SoC 301A that is coupled to SoC 300, such as shown in FIG. 3A.

Figure 4:
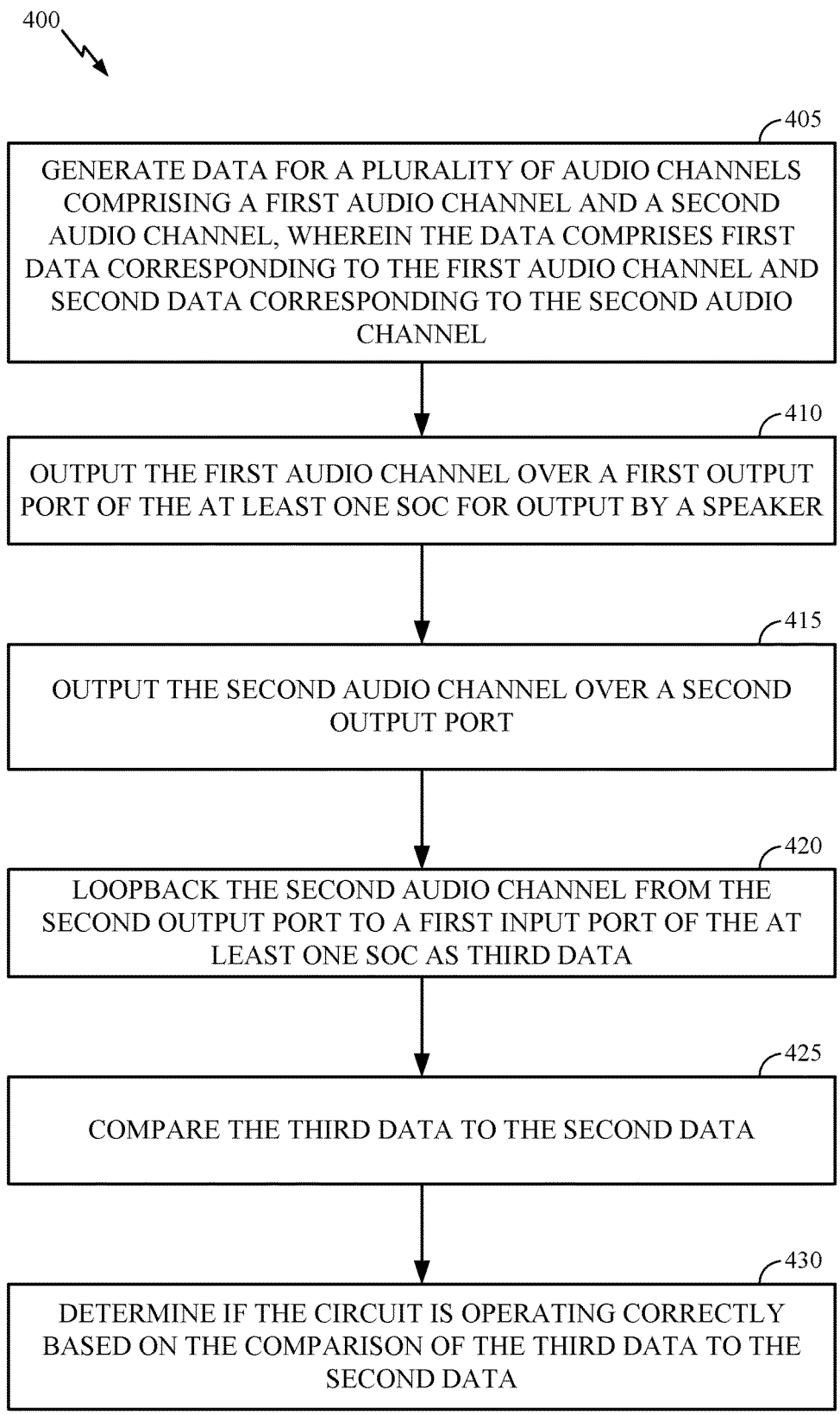
FIG. 4 is a flowchart that illustrates example operations for testing operation of a system-on-chip (SoC).

FIG. 4 is a flowchart that illustrates example operations 400 for testing operation of a SoC. Operations 400 may be performed by one or more components of one or more SoCs, such as SoCs 300, 301a.

At block 405, data for a plurality of audio channels comprising a first audio channel and a second audio channel is generated, wherein the data comprises first data corresponding to the first audio channel and second data corresponding to the second audio channel. For example, the first audio data may include non-safety critical audio data. The second audio data may include a reference signal and/or a reference pattern.

At block 410, the first audio channel is output over a first output port of at least one SoC for output by a speaker. At block 415, the second audio channel is output over a second output port.

At block 420, the second audio channel from the second output port is looped back to a first input port of the at least one SoC as third data. At block 425, the third data is compared to the second data. At block 430, it is determined if the at least one SoC is operating correctly based on the comparison of the third data to the second data. For example, if the second data and the third data both include the same reference signal and/or reference pattern, then the at least one SoC may be operating correctly.

In some configurations, the term(s) 'communicate,' 'communicating,' and/or 'communication' may refer to 'receive,' 'receiving,' 'reception,' and/or other related or suitable aspects without necessarily deviating from the scope of the present disclosure. In some configurations, the term(s) 'communicate,' 'communicating,' 'communication,' may refer to 'transmit,' 'transmitting,' 'transmission,' and/or other related or suitable aspects without necessarily deviating from the scope of the present disclosure.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits.

One or more of the components, steps, features and/or functions illustrated herein may be rearranged and/or combined into a single component, step, feature or function or embodied in several components, steps, or functions. Additional elements, components, steps, and/or functions may also be added without departing from novel features disclosed herein. The apparatus, devices, and/or components illustrated herein may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

These apparatus and methods described in the detailed description and illustrated in the accompanying drawings by various blocks, modules, components, circuits, steps, processes, algorithms, etc. (collectively referred to as "elements"). These elements may be implemented using hardware, software, or combinations thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, firmware, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, or combinations thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, PCM (phase change memory), flash memory, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

What is claimed is:

1. An audio output diagnostic circuit, the circuit comprising:
   at least one system-on-chip (SoC) being configured to:
      generate data for a plurality of audio channels comprising a first audio channel and a second audio channel, wherein the data comprises first data corresponding to the first audio channel and second data corresponding to the second audio channel;
      output the first audio channel over a first output port of the at least one SoC for output by a speaker;
      output the second audio channel over a second output port;
      loopback the second audio channel from the second output port to a first input port of the at least one SoC as third data;
      compare the third data to the second data; and
      determine if the circuit is operating correctly based on the comparison of the third data to the second data.

2. The circuit of claim 1, wherein the plurality of audio channels are multiplexed using time division multiplexing (TDM) and carried on a single data line, and wherein the first output port, the second output port, and the first input port correspond to TDM ports.

3. The circuit of claim 1, wherein the first data corresponds to a first audio signal, and wherein the second data corresponds to a second audio signal and a reference signal, wherein comparing the third data to the second data comprises performing a spectrum analysis of the third data to determine if the third data includes a frequency response corresponding to the reference signal.

4. The circuit of claim 3, wherein the at least one SoC is further configured to output the second audio channel over the second output port for output by the speaker.

5. The circuit of claim 1, wherein the second data comprises a data pattern, wherein comparing the third data to the second data comprises determining if the third data corresponds to the data pattern, and wherein the second audio channel is not output by the speaker.

6. The circuit of claim 1, wherein the at least one SoC comprises an application processor configured to generate the data, a digital signal processor configured to output the first audio channel and the second audio channel, and a monitor processor configured to compare the third data to the second data and determine if the circuit is operating correctly.

7. The circuit of claim 6, wherein the application processor comprises a first core on a first SoC of the at least one SoC, and wherein the monitor processor comprises a second core on the first SoC.

8. The circuit of claim 6, wherein the application processor comprises a first core on a first SoC of the at least one SoC, and wherein the monitor processor comprises a second core on a second SoC of the at least one SoC.

9. The circuit of claim 1, wherein the at least one SoC is further configured to process the generated data along a data flow path and validate the data flow path, wherein determining if the circuit is operating correctly is further based on the validation of the data flow path.

10. The circuit of claim 9, wherein validating the data flow path comprises:
    incrementing one or more counters when data is received at one or more points along the data flow path; and
    determining if a rate of change of the one or more counters satisfies one or more thresholds.

11. The circuit of claim 1, wherein the second data comprises audio data for safety sounds for car audio, and wherein the first data comprises other audio data.

12. A method for testing a system-on-chip (SoC), the method comprising:
    generating data for a plurality of audio channels comprising a first audio channel and a second audio channel, wherein the data comprises first data corresponding to the first audio channel and second data corresponding to the second audio channel;
    outputting the first audio channel over a first output port of the SoC for output by a speaker;
    outputting the second audio channel over a second output port;
    looping back the second audio channel from the second output port to a first input port of the SoC as third data;
    comparing the third data to the second data; and
    determining if the SoC is operating correctly based on the comparison of the third data to the second data.

13. The method of claim 12, wherein the plurality of audio channels are multiplexed using time division multiplexing (TDM) and carried on a single data line, and wherein the first output port, the second output port, and the first input port correspond to TDM ports.

14. The method of claim 12, wherein the first data corresponds to a first audio signal, and wherein the second data corresponds to a second audio signal and a reference signal, wherein comparing the third data to the second data comprises performing a spectrum analysis of the third data to determine if the third data includes a frequency response corresponding to the reference signal.

15. The method of claim 14, further comprising outputting the second audio channel over the second output port for output by the speaker.

16. The method of claim 12, wherein the second data comprises a data pattern, wherein comparing the third data to the second data comprises determining if the third data corresponds to the data pattern, and wherein the second audio channel is not output by the speaker.

17. The method of claim 12, further comprising processing the generated data along a data flow path and validating the data flow path, wherein determining if the circuit is operating correctly is further based on the validation of the data flow path.

18. The method of claim 17, wherein validating the data flow path comprises:
    incrementing one or more counters when data is received at one or more points along the data flow path; and
    determining if a rate of change of the one or more counters satisfies one or more thresholds.

19. The method of claim 12, wherein the second data comprises audio data for safety sounds for car audio, and wherein the first data comprises other audio data.

20. An audio output diagnostic circuit, the circuit comprising:
    means for generating data for a plurality of audio channels comprising a first audio channel and a second audio channel, wherein the data comprises first data corresponding to the first audio channel and second data corresponding to the second audio channel;

means for outputting the first audio channel over a first output port of a system-on-chip (SoC) for output by a speaker;

means for outputting the second audio channel over a second output port;

means for looping back the second audio channel from the second output port to a first input port of the SoC as third data;

means for comparing the third data to the second data; and means for determining if the SoC is operating correctly based on the comparison of the third data to the second data.

21. The circuit of claim 20, wherein the plurality of audio channels are multiplexed using time division multiplexing (TDM) and carried on a single data line, and wherein the first output port, the second output port, and the first input port correspond to TDM ports.

22. The circuit of claim 20, wherein the first data corresponds to a first audio signal, and wherein the second data corresponds to a second audio signal and a reference signal, wherein means for comparing the third data to the second data comprises means for performing a spectrum analysis of the third data to determine if the third data includes a frequency response corresponding to the reference signal.

23. The circuit of claim 22, further comprising means for outputting the second audio channel over the second output port for output by the speaker.

24. The circuit of claim 20, wherein the second data comprises a data pattern, wherein means for comparing the third data to the second data comprises means for determining if the third data corresponds to the data pattern, and wherein the second audio channel is not output by the speaker.

25. The circuit of claim 20, further comprising means for processing the generated data along a data flow path and means for validating the data flow path, wherein determining if the circuit is operating correctly is further based on the validation of the data flow path.

26. The circuit of claim 20, wherein means for validating the data flow path comprises:

means for incrementing one or more counters when data is received at one or more points along the data flow path; and means for determining if a rate of change of the one or more counters satisfies one or more thresholds.

27. A non-transitory computer readable medium having instructions stored thereon for causing a circuit to perform a method of testing a system-on-chip (SoC), the method comprising: generating data for a plurality of audio channels comprising a first audio channel and a second audio channel, wherein the data comprises first data corresponding to the first audio channel and second data corresponding to the second audio channel; outputting the first audio channel over a first output port of the SoC for output by a speaker; outputting the second audio channel over a second output port; looping back the second audio channel from the second output port to a first input port of the SoC as third data; comparing the third data to the second data; and determining if the SoC is operating correctly based on the comparison of the third data to the second data.

28. The non-transitory computer readable medium of claim 27, wherein the first data corresponds to a first audio signal, and wherein the second data corresponds to a second audio signal and a reference signal, wherein comparing the third data to the second data comprises performing a spectrum analysis of the third data to determine if the third data includes a frequency response corresponding to the reference signal.

29. The non-transitory computer readable medium of claim 27, wherein the second data comprises a data pattern, wherein comparing the third data to the second data comprises determining if the third data corresponds to the data pattern, and wherein the second audio channel is not output by the speaker.

30. The non-transitory computer readable medium of claim 27, wherein the method further comprises processing the generated data along a data flow path and validating the data flow path, wherein determining if the circuit is operating correctly is further based on the validation of the data flow path.

* * * * *